United States Patent [19]
Moorey

[11] 4,012,645
[45] Mar. 15, 1977

[54] TIMING CIRCUIT
[75] Inventor: Ernest James Moorey, Ivybridge, England
[73] Assignee: M. L. Engineering (Plymouth) Limited, Plymouth, England
[22] Filed: Mar. 18, 1975
[21] Appl. No.: 559,469
[30] Foreign Application Priority Data
Mar. 19, 1974 United Kingdom ............ 12116/74
[52] U.S. Cl. .......................... 307/293; 307/235 W; 320/1; 328/129
[51] Int. Cl.$^2$ ......................................... H03K 5/13
[58] Field of Search .......... 307/293, 294, 273, 246, 307/235 T, 227, 235 W; 320/1; 328/127, 219; 102/70.2 R

[56] References Cited
UNITED STATES PATENTS

| | | | |
|---|---|---|---|
| 3,121,803 | 2/1964 | Watters | 307/227 |
| 3,469,116 | 9/1969 | Nomura | 307/273 |
| 3,725,681 | 4/1973 | Frederiksen | 307/246 |

OTHER PUBLICATIONS
Bray, K. J., Electronics, Mar. 18, 1968, p. 94.

Primary Examiner—John Zazworsky
Assistant Examiner—Marcus S. Rasco
Attorney, Agent, or Firm—Sughrue, Rothwell, Mion, Zinn & Macpeak

[57] ABSTRACT

A fail-safe timing circuit has a timing capacitor which is charged progressively in steps through a switching arrangement to cause a biasing potential of a threshold device to change progressively. This biasing potential is normally outside the switching range required to cause changeover of the threshold device, and is only brought within this range after a timed interval determined by the capacitor. If the capacitor fails in any sense, the biasing potential fails to reach the switching range and the threshold device is not triggered.

5 Claims, 3 Drawing Figures

TIMING CIRCUIT

BACKGROUND OF THE INVENTION

This invention relates to timing circuits.

It is common to use a resistive-capacitive network in electronic timing circuits, in which a potential derived from the charging of a capacitor through a resistive network causes a threshold or switching device to respond when this potential reaches a predetermined threshold.

In order to ensure that a timing circuit operates in a fail-safe manner, it is desirable that in the event of failure of the timing capacitor, either by short circuiting or open circuiting, the threshold potential of the switching device is not exceeded. The usual known type of capacitive timing circuit does not meet with this criterion in that failure of the capacitor can result in the timing of an interval, albeit shorter than the designed interval, which in the context of a signalling system could be potentially dangerous.

An object of the present invention is to provide a timing circuit including a timing capacitor in which failure of the capacitor results in effective disablement of the timing circuit, so that the circuit as a whole fails to safety.

SUMMARY OF THE INVENTION

According to the invention there is provided a timing circuit comprising a threshold device having a biasing network such that the device is normally in a first state, and a timing capacitor which is arranged to be charged progressively in operation of the circuit and which is connected to the biasing network of the threshold device in such a way that the progressive charging of the capacitor causes a biasing potential at the threshold device to fall within a given range after a predetermined interval, to place the device in a second state, while in the event of failure of the capacitor the biasing potential of the threshold device remains outside the said range and the device remains in its first state.

Since the biasing potential of the threshold device is obtained through the timing capacitor, the failure of the latter will either result in the biasing potential remaining at the normal level determined by the biasing network, in which the device is in its first state, or will result in a biasing potential outside the said operating range, so that the threshold device again remains in its first state: under no circumstances can the threshold device achieve the second state in the event of failure of the capacitor, so that the timing circuit is inherently fail-safe in this respect.

In a preferred embodiment of the invention the capacitor has a charging circuit including two switches connected to opposite sides of the capacitor and arranged to be closed for fixed intervals in alternation, so that the opposite sides of the capacitor are alternately referred to a reference potential during said intervals, at least one side of the capacitor being also connected through a resistance to a supply potential so that the potential difference across the capacitor rises in progressive steps each time the switch connected to the other side of the capacitor is closed, the biasing potential of the threshold device being derived from the said other side of the capacitor.

Preferably the two switches comprise solid state switching elements controlled by antiphase square wave switching signals derived from a multivibrator or square wave generator. The multivibrator or square wave generator may be driven from a direct current supply independent of that which supplies the biasing network.

The threshold device preferably comprises a transistor switching circuit which switches from a first to a second state when the biasing potential applied thereto falls within the said operating range. Normally the switching circuit would be in an 'OFF' state and would be switched into its 'ON' state when the biasing potential falls within said range, causing an associated circuit such as an amplifier to be switched on.

BRIEF DESCRIPTION OF THE DRAWINGS

The invention will now be described, by way of example, with reference to the accompanying drawings, in which.

THE CIRCUIT OF FIG. 1

Figure 1:
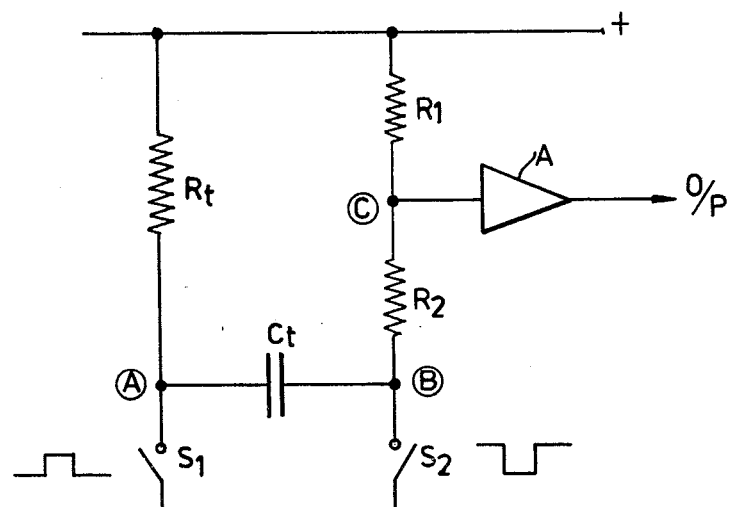
FIG. 1 is a schematic diagram of a timing circuit according to the embodiment of the invention.

Referring first to FIG. 1, the timing circuit according to the invention includes an amplifier A associated with a threshold input circuit (not shown) such that the amplifier A operates to provide an output only when the potential at the input to the amplifier is within a predetermined operating range. The operation of the amplifier A will therefore be dependent upon the potential applied to the input of the amplifier relative to the operating range of the latter. This potential is derived from the timing circuit according to the invention, as hereinafter described.

The input of the amplifier is derived at a point C between two resistors $R_1$, $R_2$ connected in series with a solid state switching element $S_2$ across a direct current supply. The resistors $R_1$, $R_2$ form a biasing network such that when the switch $S_2$ is closed the potential at the point C is outside the operating range of the amplifier A, so that the latter is normally in the off state.

A timing capacitor $C_t$ is connected to the biasing network of the amplifier A, one side of the capacitor $C_t$ being connected to the positive voltage supply line through a timing resistor $R_t$ the other side being connected to the same positive supply line through the series-connected resistors $R_1$, $R_2$. The side of the capacitor $C_t$ connected to the timing resistor $R_t$ is connectable to a reference potential, conveniently ground, through a solid state switching element $S_1$, while the other side of the capacitor $C_t$ is connectable to the same reference potential through the solid state switching element $S_2$.

The two solid state switching elements $S_1$, $S_2$ are closed and opened at regular intervals in alternation, preferably by means of antiphase square wave switching control signals derived from a suitable square wave generator, as indicated diagrammatically in FIG. 1. The alternate closure of the switches $S_1$, $S_2$ causes the potential on the opposite sides of the capacitor $C_t$ to be referred to ground alternately, the potential on the other side of the capacitor $C_t$ being determined by the charging rate of the capacitor $C_t$ through the resistance $R_t$.

OPERATION

Figure 2:
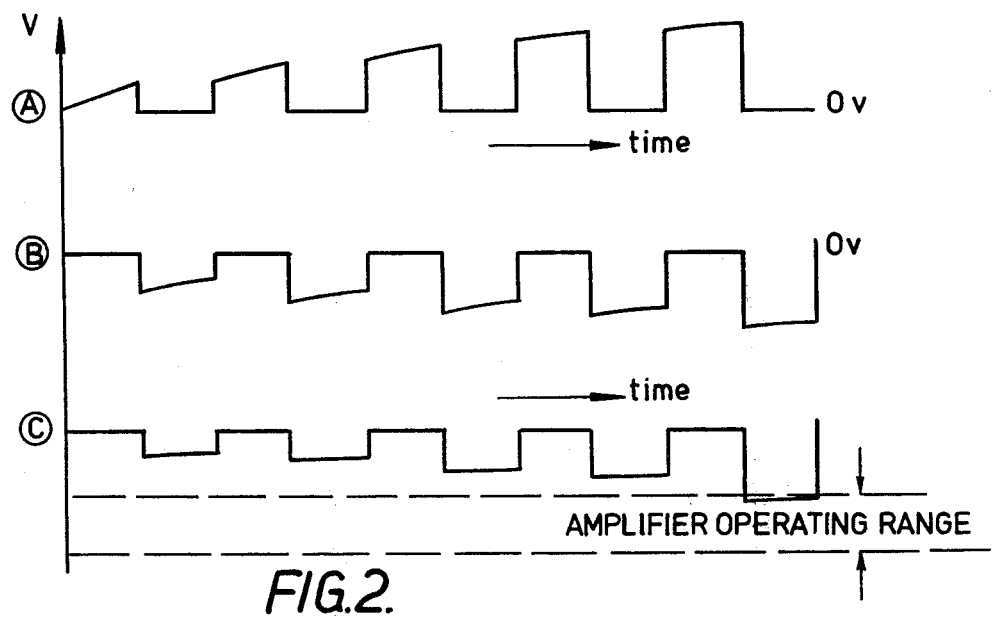
FIG. 2 illustrates voltage wave forms associated with the operation of the circuit shown in FIG. 1.

The operation of the circuit will be explained with reference to FIG. 2, which illustrates schematically the voltage-wave-forms at the points designated A, B and C in FIG. 1. When the circuit is first switched on the potential at point C is outside the operating range of the amplifier A, as illustrated in FIG. 2. The antiphase switching wave-forms applied to the switching elements $S_1$, $S_2$ cause the capacitor $C_t$ to charge initially through the resistor $R_t$ when the switch $S_2$ is closed. In the next half cycle, when the switch $S_2$ is open and the switch $S_1$ closed, the potential at point B becomes negative with respect to ground and starts to rise towards ground slowly with a time constant determined by $R_1$ and $R_2$. It is arranged that the resistance of the series-combination $R_1$, $R_2$ is greater than $R_t$, so that the capacitor $C_t$ does not discharge completely during the time that the switch $S_1$ is closed. Consequently, in the next half cycle, when the switch $S_2$ is closed again, the capacitor $C_t$ is charged by a further increment through the resistor $R_t$, and the process repeats itself with the potential at point B, and that at point C, falling in progressive steps each time the switch $S_2$ is opened until after a predetermined interval, the potential at point C is brought within the operating range of the amplifier A, causing the latter to switch on. The time interval between the initial switching on of the circuit and the switching on of the amplifier A will be determined by the magnitude of the resistor $R_t$ and the size of the capacitor $C_t$.

In the event of failure of the capacitor $C_t$ to open-circuit the biasing resistance network $R_1$, $R_2$ will ensure that the biasing potential at the input C to the amplifier A is outside the operating range of the latter, while if the capacitor $C_t$ is short-circuited the progressive charging of the capacitor $C_t$ described above cannot occur and the potential at point C again remains outside the operating range of the amplifier A.

It will be appreciated than in practice the point B, that is, the side of the capacitor $C_t$ to which the switch $S_2$ is connected, need not necessarily be connected through the resistors $R_1$, $R_2$ to the supply line as shown, provided the side A of the capacitor $C_t$ remote from the amplifier a is connected through the timing resistor $R_t$ to the supply line.

THE CIRCUIT OF FIG. 3

Figure 3:
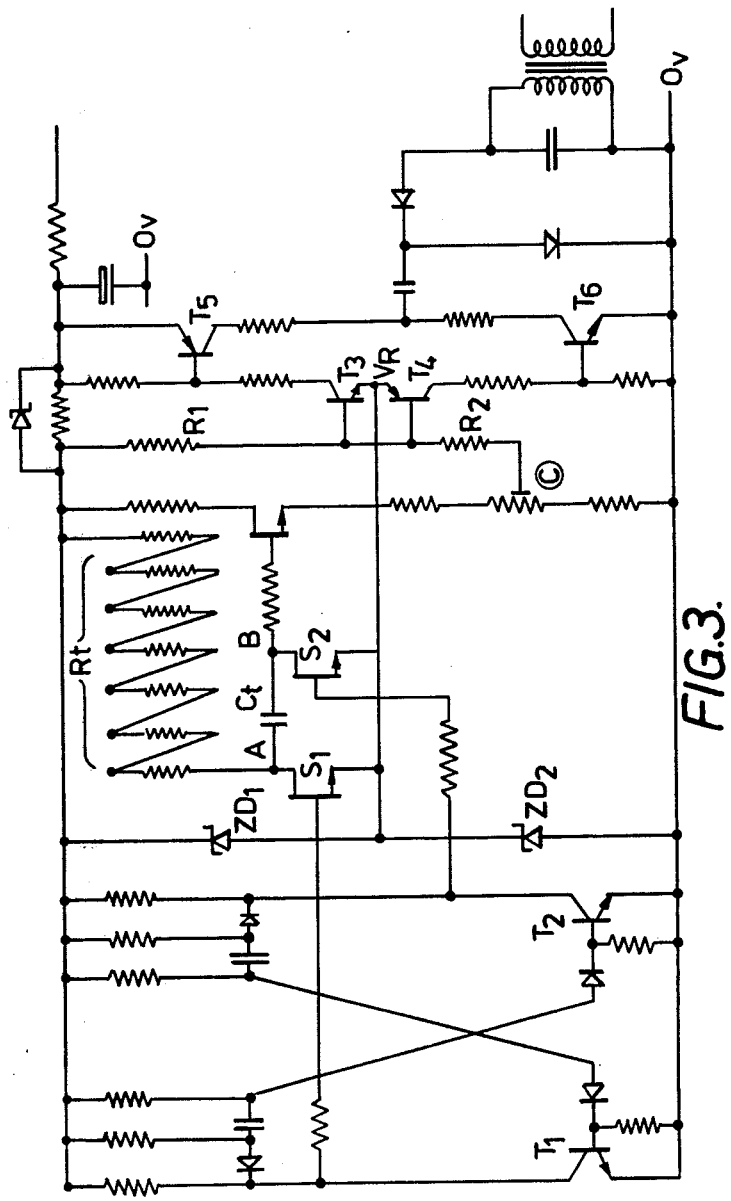
FIG. 3 is a typical circuit diagram of a timing circuit according to a practical embodiment of the present invention.

FIG. 3 illustrates a typical practical embodiment of the invention, in which the two switching elements $S_1$ and $S_2$ are constituted by respective field effect transistors the switching potentials of which comprise antiphase square wave voltages derived from a multivibrator oscillator comprising transistors $T_1$ and $T_2$.

The amplifier A in this example consists of transistors $T_3$, $T_4$, $T_5$ and $T_6$ which amplify the positive-and negative-going portions of the square wave signal applied to the input point C through a threshold device comprising a pair of PNP and NPN transistors $T_3$, $T_4$, arranged with a common emitter connection to the reference potential. The centre of the operating range of the amplifier is determined by a reference voltage derived from zener diodes $ZD_1$ and $ZD_2$ and it is so arranged that in normal condition with the transistor switching element $S_2$ closed the biasing potential at C is outside the operating range of the amplifier and the transistor $T_4$ is switched off.

When the circuit is switched off the two field effect transistors constituting the switching elements $S_1$, $S_2$ are both rendered conductive, short circuiting the capacitor $C_t$ to ensure rapid discharge of the latter.

I claim:
1. A timing circuit comprising:
    a threshold device having an input point, and having first and second states, the threshold device being in its first state when the potential at the input point lies above a given voltage threshold and in its second state when the potential at said input point is below said given threshold, the threshold device being normally in its first state,
    a current source including a timing resistor connected to a source of charging voltage,
    a timing capacitor having a first side connected to said timing resistor and a second side connected to said input point,
    first and second switch devices connected to said first and second sides, respectively, of the timing capacitor and to a source of reference potential, said reference potential being above said threshold, and
    means for closing said first and second switch devices alternately to connect said first and second sides of the timing capacitor alternately to said source of reference potential thereby causing said timing capacitor to be charged cumulatively during successive closures of said second switch device, the potential at said input point of the threshold device changing progressively with each closure of said first switch device and falling below said given threshold only after a number of alternate closures of said first and second switch devices to cause the transition of the threshold device to a second state, while in the event of failure of the timing capacitor, the potential at said inpt point remains above said given threshold and the threshold device remains in its first state.

2. The timing circuit defined in claim 1, wherein said first and second switch devices comprise field effect transistors.

3. The timing circuit defined in claim 1, wherein said first and second switch devices comprise solid state switching elements and the means for closing said switches alternately comprise a source of opposite phase square wave switching signals.

4. The timing circuit defined in claim 3, wherein the source of square wave switching signals is a multivibrator.

5. The timing circuit according to claim 1 wherein the threshold device comprises two transistors connected across said source of charging voltage and having a common emitter connection to the reference potential.

* * * * *